United States Patent
Chen et al.

(10) Patent No.: US 11,619,766 B2
(45) Date of Patent: Apr. 4, 2023

(54) MICRO- AND NANO-HOT EMBOSSING METHOD FOR OPTICAL GLASS LENS ARRAYS

(71) Applicants: No.59 Institute of China Ordnance Industry, Chongqing (CN); Shenzhen University, Shenzhen (CN); University of Science and Technology Liaoning, Liaoning (CN)

(72) Inventors: Qiang Chen, Chongqing (CN); Feng Gong, Shenzhen (CN); Zhiwen Xie, Liaoning (CN); Kangsen Li, Shenzhen (CN); Xinfang Huang, Liaoning (CN); Yuanyuan Wan, Chongqing (CN)

(73) Assignees: No.59 Institute of China Ordnance Industry, Chongqing (CN); Shenzhen University, Shenzhen (CN); University of Science and Technology Liaoning, Anshan (CN)

( * ) Notice: Subject to any disclaimer, the term of this patent is extended or adjusted under 35 U.S.C. 154(b) by 795 days.

(21) Appl. No.: 16/581,735

(22) Filed: Sep. 24, 2019

(65) Prior Publication Data
US 2020/0333511 A1 Oct. 22, 2020

(30) Foreign Application Priority Data
Apr. 17, 2019 (CN) .......................... 201910309977.4

(51) Int. Cl.
*G02B 3/00* (2006.01)
*G03F 7/004* (2006.01)
(Continued)

(52) U.S. Cl.
CPC .......... *G02B 3/0031* (2013.01); *C03B 11/082* (2013.01); *C03B 11/086* (2013.01);
(Continued)

(58) Field of Classification Search
CPC ... G02B 3/0031; C03B 11/082; C03B 11/086; C03B 2215/66; C03B 11/125;
(Continued)

(56) References Cited

U.S. PATENT DOCUMENTS 5,276,538 A * 1/1994 Monji .................... C03B 11/005
359/620
9,223,202 B2 * 12/2015 Choi ....................... B82Y 40/00
(Continued)

FOREIGN PATENT DOCUMENTS

| CN | 102707378 A | 10/2012 |
|---|---|---|
| CN | 104844015 A | 8/2015 |

(Continued)

*Primary Examiner* — Mohamed K Amara

(57) ABSTRACT

A micro- and nano-hot embossing method for an optical glass lens array, including: preparing a mold with a micro-hole array by micro EDM, where the micro-hole array matches an optical glass lens array and the mold is made of a hard metal material which is conductive and meets strength and temperature requirements; preparing a nano nitride-based graded composite coating on a surface of the mold by magnetron sputtering; and pre-fabricating a glass preform and then placing the glass preform on the surface of the mold; heating the glass preform and hot embossing by a glass molding machine in vacuum; cooling in nitrogen atmosphere; and demolding to produce the optical glass lens array. The micro- and nano-hot embossing method of the present invention improves the surface quality of the optical glass lens array and reduces the cost and difficulty for manufacturing.

9 Claims, 2 Drawing Sheets

(51) Int. Cl.
   *C03B 11/08* (2006.01)
   *B82Y 40/00* (2011.01)
   *B82Y 35/00* (2011.01)

(52) U.S. Cl.
   CPC ............ *G03F 7/0043* (2013.01); *B82Y 35/00* (2013.01); *B82Y 40/00* (2013.01)

(58) Field of Classification Search
   CPC . C03B 23/02; C03B 2215/11; C03B 2215/22; C03B 2215/38; C03B 2215/414; C03B 23/03; G03F 7/0043; G03F 7/0002; G03F 7/0005; B82Y 35/00; B82Y 40/00; B82Y 20/00; B82Y 30/00; C23C 14/0641; C23C 14/35
   See application file for complete search history.

(56) References Cited

U.S. PATENT DOCUMENTS

| | | | | |
|---|---|---|---|---|
| 10,307,871 | B2* | 6/2019 | Coleman | B23P 11/00 |
| 10,890,783 | B2* | 1/2021 | Tan | G02B 3/0031 |
| 2003/0227688 | A1* | 12/2003 | Houlihan | G02B 3/0031 |
| | | | | 359/619 |
| 2004/0079114 | A1* | 4/2004 | Aitken | C03B 19/06 |
| | | | | 65/102 |
| 2007/0131646 | A1* | 6/2007 | Donnelly | B29D 11/00365 |
| | | | | 216/2 |
| 2008/0309900 | A1* | 12/2008 | Oliver | G03F 7/0002 |
| | | | | 156/247 |
| 2009/0244713 | A1* | 10/2009 | Kodera | G02B 3/0031 |
| | | | | 359/619 |
| 2013/0101795 | A1* | 4/2013 | Khine | G03F 7/0005 |
| | | | | 430/8 |
| 2017/0345655 | A1* | 11/2017 | Posseme | H01L 21/02694 |
| 2020/0331790 | A1* | 10/2020 | Chen | C23C 14/352 |
| 2021/0216009 | A1* | 7/2021 | Cheng | G03F 7/0005 |
| 2021/0242354 | A1* | 8/2021 | Wang | H01L 31/105 |

FOREIGN PATENT DOCUMENTS

| | | | | | |
|---|---|---|---|---|---|
| CN | 105676321 | B | * | 1/2018 | ............ G02B 3/0018 |
| CN | 110174818 | A | * | 8/2019 | ............... G03F 7/00 |
| CN | 110482852 | A | * | 11/2019 | ............. C03B 23/00 |
| CN | 109097743 | B | * | 3/2020 | ......... C23C 14/0021 |
| CN | 112630872 | A | * | 4/2021 | ............... G02B 3/00 |
| WO | WO-0162400 | A2 | * | 8/2001 | ....... B29D 11/00365 |
| WO | WO-2020020903 | A1 | * | 1/2020 | ......... B29C 33/3842 |

* cited by examiner

MICRO- AND NANO-HOT EMBOSSING METHOD FOR OPTICAL GLASS LENS ARRAYS

CROSS-REFERENCE TO RELATED APPLICATIONS

This application claims the benefit of priority from Chinese Patent Application No. CN201910309977.4, filed on Apr. 17, 2019. The content of the aforementioned application, including any intervening amendments thereto, is incorporated herein by reference in its entirety.

TECHNICAL FIELD

This application relates to glass molding, and more particularly to micro- and nano-hot embossing method for optical glass lens arrays.

BACKGROUND OF THE INVENTION

Due to unique geometrical and optical properties, the micro-array optical glass elements, which has been one of the essential elements in the optical imaging system, plays a significant part in the advancement of the modem optical technique. As the manufacturing technique for optical lenses develops, the micro-array optical glass elements are required to be high in dimensional accuracy, good in surface quality and diverse in unique optical properties, thus it is an inevitable trend to produce those glass elements with low cost, high precision and mass production. Compared to traditional manufacturing methods for the micro-array optical glass elements, such as precision grinding, ultra-precision turning, polishing, lithography, ion beam machining and laser beam machining, the micro- and nano-hot embossing method has advantages of low cost, high efficiency, net shaping and being environment-friendly, which is considered as one of the most effective methods for manufacturing the micro-array optical glass elements, thus attracting broad attention from manufactures of optical products around the world in recent years. However, when the micro-array optical glass elements are manufactured by micro- and nano-hot embossing, the surface quality and optical properties of the optical glass element are seriously influenced due to the coupling damage of fraction at high temperature and adhesion corrosion, thus greatly reducing the service life of the mold and then increasing the cost for manufacturing the mold.

SUMMARY OF THE INVENTION

In view of above technical problems, the present invention provides a micro- and nano-hot embossing method for an optical glass lens array, which aims to improve the surface quality of the optical glass lens array and reduce the cost and difficulty for manufacturing the optical glass lens array.

The present invention provides the following technical solutions to realize above object.

A micro- and nano-hot embossing method for an optical glass lens array, comprising:

1) preparing a mold with a micro-hole array by micro EDM, wherein the micro-hole array matches an optical glass lens array, and the mold is made of a hard metal material which is conductive and meets strength and temperature requirements;

2) preparing a nano nitride-based graded composite coating on a surface of the mold by magnetron sputtering; and 3) pre-fabricating a glass preform and then placing the glass preform on the surface of the mold; heating the glass preform, and hot embossing by a glass molding machine in vacuum; cooling in a nitrogen atmosphere; and demolding to produce the optical glass lens array.

Further, in step 2, the nano nitride-based graded composite coating is a $Cr_xW_yN$ coating or a $Cr_{x1}W_{y1}C_zN$ coating, wherein in the $Cr_xW_yN$ coating, $20<x<40$, and $20<y<40$; in the $Cr_{x1}W_{y1}C_zN$ coating, $10<x1<20$, $10<y1<20$, and $10<z<20$. In some embodiments, the nano nitride-based graded composite coating is a $Cr_{x1}W_{y1}C_zN$ coating, wherein $10<x1<20$, $10<y1<20$, and $10<z<20$.

In some embodiments, step 2 further comprises: starting a magnetron sputtering system which is set to have a vacuum for sputter cleaning of $5\times10^{-1}$ Pa, a bias voltage of 120 V and a time for sputter cleaning of 1-2 h; washing a target for 15 min with a power of 300 W and a bias voltage of 50 V; starting the magnetron sputtering system for a high-purity Cr target to prepare a Cr coating having a thickness of 10-20 nm on the mold in an argon atmosphere, and then to prepare an intermediate CrN coating having a thickness of 20-40 nm on the prepared Cr coating in a nitrogen and argon atmosphere, wherein flow rates of both argon and nitrogen are controlled at 100 sccm, and a vacuum is 0.45 Pa; starting the magnetron sputtering system for high-purity Cr and W targets to prepare a $Cr_xW_yN$ coating having a thickness of 100-200 nm on the prepared intermediate CrN coating; and starting the magnetron sputtering system for high-purity Cr, W and C targets to prepare a $Cr_xW_yC_zN$ coating having a thickness of 500-1000 nm on the prepared $Cr_xW_yN$ coating.

In some embodiments, in step 3, an embossing temperature ($T_{embossing}$) in hot embossing process is between Tg and Ts. In some embodiments, the embossing temperature ($T_{embossing}$) in hot embossing process is between Tg+50° C. and Ts−30° C. Tg refers to a glass transition temperature, and Ts refers to a glass softening temperature.

In some embodiments, in step 3, the embossing force ($F_{embossing}$) in hot embossing process is between 100 to 500 N; or a radial deformation displacement of the glass preform in the micro-hole array of the mold is controlled to be 10-500 μm by exerting the embossing force ($F_{embossing}$).

In some embodiments, in step 3, after the hot embossing process, the nitrogen is filled into the mold to cool the glass and the mold, and at the same time, the embossing force is reduced to a holding force ($F_{holding}$) which is ⅟₁₀ to ³⁄₁₀ of the embossing force ($F_{embossing}$) until the glass and the mold are cooled to a room temperature. In the cooling process, when the glass is cooled to below Tg−30° C., the holding force ($F_{holding}$) is removed, and the glass is demolded after the glass and the mold are cooled to the room temperature.

In some embodiments, the mold is made of carboloy, chrome-molybdenum steel or high-speed steel.

The present invention has the following beneficial effects. The micro- and nano-hot embossing method improves the surface quality of the optical glass lens array. In the optical glass lens array, the roughness of a convex surface is just 2-3 nm, and the roughness of surfaces contacting the mold with micro-hole array is 4-5 nm. In existing micro- and nano-embossing methods, mold holes are processed by a specific mold core which is extremely expensive and large in loss, and specifically, each mold core will cost 20000-30000 yuan. Compared to the existing micro- and nano-hot embossing methods, the hot embossing method of the present invention requires no mold core and costs only hundreds yuan for manufacturing the micro-hole array, which reduces the cost by more than 90%. In addition, the manufacturing difficulty of the optical glass lens arrays is reduced, and the optical glass lens array can be directly used without processing the surface. The effective deformation on the contact surface, and adhesion, friction and shear between the glass element and the mold are greatly reduced, thus improving the service life of the mold.

Figure 1:
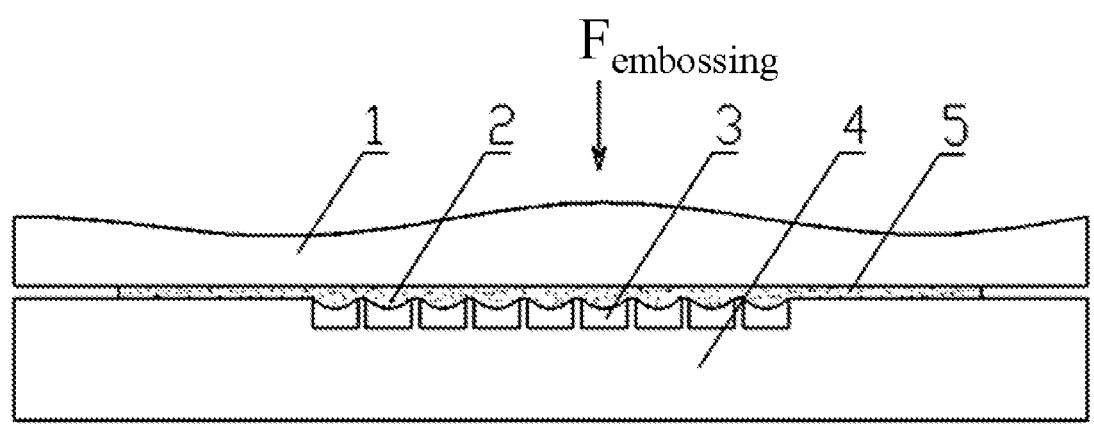
FIG. 1 is a diagram showing a hot embossing process of a micro- and nano-hot embossing method for an optical glass lens array according to an embodiment of the present invention.

In the drawings: 1, head of glass molding machine; 2, optical glass lens array; 3, micro-hole array; 4, mold body; 5, glass preform.

DETAILED DESCRIPTION OF EMBODIMENTS

The present invention will be further described with reference to the embodiments, but these embodiments are not intended to limit the scope of the present invention. Simple substitutions and adjustments made by those skilled in the art according to the present invention shall fall within the scope of the present invention.

Taking L-BAL35 glass lens arrays as an example, a micro- and nano-hot embossing method for an optical glass lens array comprises the following steps.

1) A mold with a micro-hole array is prepared by micro EDM, where the size and contour of the micro-hole array match that of an optical glass lens array and the mold is made of a hard metal material which is conductive and meets strength and temperature requirements, and specifically, the mold is made of carbology, chrome-molybdenum steel or high-speed steel, and in this embodiment, the mold is made of carbology. During the processing of the micro-hole array using EDM, the pulse voltage is 120 V, the pulse frequency is 0.2 MHz, the pulse width is 500 ns, and the pulse interval is 400 ns. Each micro hole of the mold for L-BAL35 glass has a diameter of 0.5 mm and a depth of 0.8 mm. When the pulse voltage is at the range of 100-150 V, micro holes with a diameter of 0.1-0.8 mm and a depth of 0.1-1 mm are processed as needed.

Figure 2:
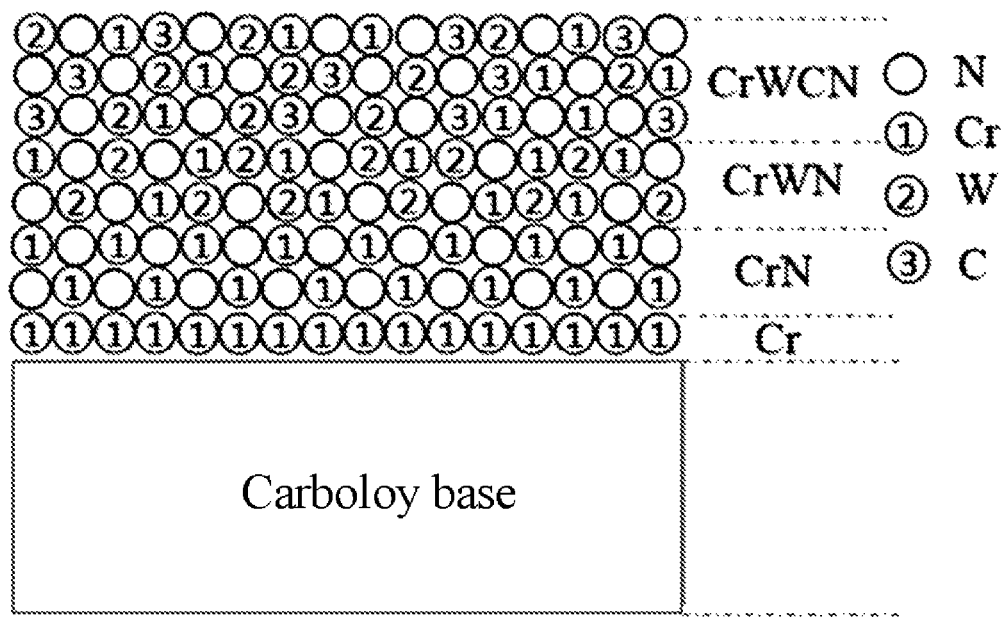
FIG. 2 is a diagram showing a nano nitrogen-based graded composite coating according to an embodiment of the present invention.

2) a nano nitride-based graded composite coating is prepared on a surface of the mold by magnetron sputtering, specifically comprising the following steps. A magnetron sputtering system is started which is set to have a vacuum for sputter cleaning of $5\times10^{-3}$ Pa, a bias voltage of 120 V, and the time for sputter cleaning of 2 h (the time for sputter cleaning can be set to be 1 h to improve the efficiency). A target is washed for 15 minutes with power of 300 W and a bias voltage of 50 V, where the motor speed is 2 rpm. During washing, the target is covered with a cover to prevent sputtering onto a substrate. The magnetron sputtering system for a high-purity Cr target is started to prepare a Cr coating having a thickness of 10-20 nm on the mold in an argon atmosphere, and then to prepare an intermediate CrN coating having a thickness of 20-40 nm in a nitrogen and argon atmosphere, where flow rates of both argon and nitrogen are controlled at 100 sccm, and the vacuum is 0.45 Pa. Then, the magnetron sputtering system for high-purity Cr and W targets are started to prepare a $Cr_{25}W_{25}N_{50}$ coating having a thickness of 100-200 nm on the prepared intermediate CrN coating. Then, the magnetron sputtering system for high-purity Cr, W and C targets are started to prepare a $Cr_{15}W_{15}C_{15}N_{55}$ coating having a thickness of 500-1000 nm on the prepared $Cr_{25}W_{25}N_{50}$ coating. During the preparing, the thickness of the coating is controlled by adjusting the deposition time, where the time for depositing the Cr coating is set to be 10-15 min; the time for depositing the CrN coating is set to be 10-15 min; the time for depositing the $Cr_{25}W_{25}N_{50}$ is set to be 20-30 min; and the time for depositing the $Cr_{15}W_{15}C_{15}N_{55}$ coating is set to be 60-120 min. The diagram showing a microstructure of the prepared nano nitride-based graded composite coating is shown in FIG. 2.

3) Appropriate amount of the glass preform is calculated and weighed according to the size of the glass lens array and the glass preform is heated after placed in the mold of micro-hole arrays, and specifically, the glass preform is placed on the surface of the mold deposited with the nano nitride-based graded composite coating. When the glass preform is heated between 517 and 619° C., the glass preform is hot embossed by the glass precision molding machine. As shown in FIG. 2, the embossing force ($F_{embossing}$) is controlled at 100-500 N, or a radial deformation displacement of the glass preform in the micro holes of the mold is controlled to be 10-500 μm by exerting appropriate embossing force ($F_{embossing}$). The radial deformation displacement can be controlled by the existing TOSHIBA's glass molding press (GMP) and Shenzhen University's precision glass molding machine (SZU's PGMM30). After the hot embossing, the nitrogen is filled into the mold to cool the glass and the mold, and at the same time, the embossing force is reduced to a holding force ($F_{holding}$) which is $\frac{1}{10}$ to $\frac{3}{10}$ of the embossing force ($F_{embossing}$) until the glass and the mold are cooled to a room temperature. In the cooling process, when the glass is cooled to below Tg–30° C., the holding force ($F_{holding}$) is removed, and the glass is demolded after the glass and the mold are cooled to the room temperature.

What is claimed is:

1. A micro- and nano- hot embossing method for an optical glass lens array, comprising:
preparing a mold with a micro-hole array by micro electrical discharge machining, wherein the micro-hole array matches an optical glass lens array, and the mold is made of a hard metal material;
preparing a nano nitride-based graded composite coating on a surface of the mold by magnetron sputtering; and
pre-fabricating a glass preform and placing the glass preform on the surface of the mold; heating the glass preform and hot embossing by a glass molding machine in vacuum; cooling in a nitrogen atmosphere and demolding to produce the optical glass lens array.

2. The micro- and nano-hot embossing method of claim 1, wherein the nano nitride-based graded composite coating is a $Cr_xW_yN$ coating or a $Cr_{x1}W_{y1}C_zN$ coating; in the $Cr_xW_yN$ coating, 20<x<40, and 20<y<40; and in the $Cr_{x1}W_{y1}C_zN$ coating, 10<x1<20, 10<y1<20, and 10<z<20.

3. The micro- and nano-hot embossing method of claim 1, wherein the nano nitride-based graded composite coating is a $Cr_{x1}W_{y1}C_zN$ coating, wherein 10<x1<20, 10<y1<20, and 10<z<20.

4. The micro- and nano-hot embossing method of claim 3, wherein step 2) further comprises: starting a magnetron sputtering system which is set to have a vacuum for sputter cleaning of $5\times10^{-3}$ Pa, a bias voltage of 120 V and a time for sputter cleaning of 1-2 h; washing a target for 15 minutes with a power of 300 W and a bias voltage of 50 V; starting the magnetron sputtering system for a high-purity Cr target to prepare a Cr coating having a thickness of 10-20 nm on the mold in an argon atmosphere, and then to prepare an intermediate CrN coating having a thickness of 20-40 nm on the prepared Cr coating in a nitrogen and argon atmosphere, wherein flow rates of both argon and nitrogen are controlled at 100 sccm, and a vacuum is 0.45 Pa; starting the magnetron sputtering system for high-purity Cr and W targets to prepare a $Cr_xW_yN$ coating having a thickness of 100-200 nm on the prepared intermediate CrN coating; and starting the magnetron sputtering system for high-purity Cr, W and C targets to prepare a $Cr_xW_yC_zN$ coating having a thickness of 500-1000 nm on the prepared $Cr_xW_yN$ coating.

5. The micro- and nano-hot embossing method of claim 4, wherein in the hot embossing process, an embossing temperature is between Tg and Ts; Tg refers to a glass transition temperature, and Ts refers to a glass softening temperature.

6. The micro- and nano-hot embossing method of claim 5, wherein in the hot embossing process, the embossing temperature is between Tg+50° C. and Ts−30° C.

7. The micro- and nano-hot embossing method of claim 6, wherein in the hot embossing process, an embossing force is between 100 to 500 N; or a radial deformation displacement of the glass preform in the micro-hole array of the mold is controlled to be 10-500 μm by exerting the embossing force.

8. The micro- and nano-hot embossing method of claim 7, wherein after the hot embossing process, the nitrogen is filled into the mold to cool the glass and the mold, and at the same time, the embossing force is reduced to a holding force which is 1/10 to 3/10 of the embossing force until the glass and the mold are cooled to a room temperature; in the cooling process, when the glass is cooled below Tg−30° C., the holding force is removed, and the glass is demolded after the glass and the mold are cooled to the room temperature.

9. The micro- and nano-hot embossing method of claim 1, wherein the mold with the micro-hole array is made of carboloy, chrome-molybdenum steel or high-speed steel.

\* \* \* \* \*